United States Patent
Kishimoto et al.

(10) Patent No.: US 10,439,138 B2
(45) Date of Patent: Oct. 8, 2019

(54) METHOD FOR PRODUCING DEPOSITION MASK

(71) Applicant: Sakai Display Products Corporation, Sakai-shi, Osaka (JP)

(72) Inventors: Katsuhiko Kishimoto, Osaka (JP); Susumu Sakio, Osaka (JP)

(73) Assignee: Sakai Display Products Corporation, Osaka (JP)

( * ) Notice: Subject to any disclaimer, the term of this patent is extended or adjusted under 35 U.S.C. 154(b) by 0 days.

(21) Appl. No.: 15/750,616

(22) PCT Filed: Aug. 31, 2017

(86) PCT No.: PCT/JP2017/031346
§ 371 (c)(1),
(2) Date: Sep. 19, 2018

(87) PCT Pub. No.: WO2019/043866
PCT Pub. Date: Mar. 7, 2019

(65) Prior Publication Data
US 2019/0067578 A1 Feb. 28, 2019

(51) Int. Cl.
*H01L 51/00* (2006.01)
*H01L 51/56* (2006.01)
(Continued)

(52) U.S. Cl.
CPC .......... *H01L 51/0011* (2013.01); *B23K 11/11* (2013.01); *B23K 26/0622* (2015.10);
(Continued)

(58) Field of Classification Search
None
See application file for complete search history.

(56) References Cited

U.S. PATENT DOCUMENTS

2004/0209171 A1\* 10/2004 Ibusuki ............ G03F 1/20
430/5
2015/0041793 A1\* 2/2015 Chan ............ H01L 51/0018
257/40
(Continued)

FOREIGN PATENT DOCUMENTS

| JP | 2006-188748 A | 7/2006 |
| JP | 2011-054290 A | 3/2011 |

(Continued)

OTHER PUBLICATIONS

Decision to Grant for related Japanese Application No. 2017-564944 dated Jan. 23, 2018.

*Primary Examiner* — Angel Roman
(74) *Attorney, Agent, or Firm* — Renner, Otto, Boisselle & Sklar, LLP

(57) ABSTRACT

A step of forming openings in a mask substrate includes step A of forming openings of "a" number of continual columns included in a first region (R1) including at least the (n/2)th column or the ((n+1)/2)th column; step B of forming openings of "b" number of continual columns included in a second region (R2) adjacent to the first region (R1) in a −x direction with a first gap region (RS1) being sandwiched between the first and second regions, the first gap region including "sa" number of continual columns; and step C of forming openings of "c" number of continual columns included in a third region (R3) adjacent to the first region (R1) in an x direction with a second gap region (RS2) being sandwiched between the first and third regions, the second gap region including "sb" number of continual columns. The steps B and C are performed after the step A.

21 Claims, 7 Drawing Sheets

(51) Int. Cl.
*C23C 14/04* (2006.01)
*B23K 11/11* (2006.01)
*H01L 27/32* (2006.01)
*B23K 26/08* (2014.01)
*B23K 26/22* (2006.01)
*B23K 26/0622* (2014.01)
*B23K 101/36* (2006.01)
*B23K 103/18* (2006.01)

(52) U.S. Cl.
CPC .............. *B23K 26/08* (2013.01); *B23K 26/22* (2013.01); *C23C 14/042* (2013.01); *H01L 27/3244* (2013.01); *H01L 51/56* (2013.01); *B23K 2101/36* (2018.08); *B23K 2103/18* (2018.08); *B23K 2103/26* (2018.08)

(56) References Cited

U.S. PATENT DOCUMENTS

| | | | |
|---|---|---|---|
| 2016/0115580 A1 | 4/2016 | Mizumura | |
| 2017/0141315 A1* | 5/2017 | Ikenaga | B21B 1/40 |
| 2017/0179442 A1 | 6/2017 | Wu et al. | |
| 2018/0023182 A1* | 1/2018 | Ikenaga | C23F 1/00 |
| | | | 428/137 |
| 2019/0169733 A1* | 6/2019 | Ikenaga | C25D 1/08 |

FOREIGN PATENT DOCUMENTS

| | | |
|---|---|---|
| JP | 2015-010270 A | 1/2015 |
| JP | 2017-082313 A | 5/2017 |

* cited by examiner

US 10,439,138 B2

METHOD FOR PRODUCING DEPOSITION MASK

TECHNICAL FIELD

The present invention relates to a method for producing a deposition mask, specifically, a method for producing a deposition mask preferably usable for mass production of a high-definition organic EL (electroluminescent) display device. A "deposition mask" refers to a mask usable in thin film deposition technologies (including, for example, Physical Vapor Deposition (PVD), Chemical Vapor Deposition (CVD), and the like). Hereinafter, vacuum vapor deposition, which is one type of PVD, will be described as an example.

BACKGROUND ART

Recently, organic EL display devices have been put into practice. In mass-production of middle- or small-sized organic EL display devices performed today, an organic EL layer is formed mainly by use of vacuum vapor deposition. The organic EL layer includes, for example, a hole transfer layer, an electron transfer layer, and an organic light emitting layer located between the hole transfer layer and the electron transfer layer. The hole transfer layer may also act as the organic light emitting layer. Herein, a layer that includes at least an organic light emitting layer and an electron transfer layer and is formed of an organic material will be referred to as an "organic EL layer".

An organic EL display device includes, in each of pixels, at least one organic EL light emitting element (Organic Light Emitting Diode (OLED)) and at least one TFT (Thin Film Transistor) controlling an electric current to be supplied to the corresponding OLED. Hereinafter, the organic EL display device will be referred to as an "OLED display device". The OLED display device including a switching element such as a TFT or the like in each of the OLEDs as described above is referred to as an "active matrix OLED display device". A substrate including the TFT and the OLED will be referred to as an "element substrate". A driving circuit including the TFT is referred to as a "backplane circuit" (or simply as a "backplane"). The OLED is provided on the backplane.

In an organic EL display device capable of providing color display, one color display pixel includes, for example, an R pixel, a G pixel and a B pixel. The pixels of different colors included in the color display pixel may each be referred to as a "primary color pixel". A pixel in this specification may be called as a "dot", and a color display pixel in this specification may be called as a "pixel". For example, "ppi" (pixel per inch) representing the resolution represents the number of "pixels" included in one inch.

In the case where one color display pixel includes three pixels of different colors, the three pixels of different colors may have different shapes or different sizes from each other. For example, a blue pixel having a low light emission efficiency may be large, whereas a green pixel having a high light emission efficiency may be small. Alternatively, one color display pixel may include one red pixel, one green pixel and two blue pixels. The pixels may be arrayed in a stripe form, a delta form or any of various known forms.

The organic EL layer is formed by vacuum vapor deposition by use of a deposition mask prepared for each of the colors. In addition to the organic EL layer, an electrode layer (e.g., cathode layer) on the organic EL layer may also be formed by use of a deposition mask by, for example, sputtering. The electrode layer (e.g., anode layer) below the organic EL layer may be formed by photolithography because the organic EL layer is not exposed to a developing solution.

Conventionally, a metal mask formed of a metal layer (metal plate) including a plurality of openings of a predetermined pattern is used as a deposition mask (e.g., Patent Document 1). In order to be more suitable to a higher-definition OLED display device, a deposition mask including a stack body in which a resin layer and a magnetic metal layer are stacked on each other has been proposed as a deposition mask allowing a more precise pattern than that of the metal mask to be formed therein (hereinafter, such a deposition mask including a stack body will be referred to as a "stack-type mask") (e.g., Patent Documents 2 and 3).

In this specification, among members of a deposition mask, a member including openings (through-holes through which a substance used to form a film may pass) will be referred to as a "mask substrate". In a metal mask, a metal layer (typically, a magnetic metal layer) is the mask substrate. In a stack-type mask, a stack body of the resin layer and the magnetic metal layer is the mask substrate. Among portions of a deposition mask, a portion that is to closely contact with an active region (also referred to as an "element formation region" or a "display region") of the element substrate, which is an object on which a film is to be formed (for example, an element substrate on the stage where a backplane is formed), will be referred to as an "active region formation portion".

CITATION LIST

Patent Literature

Patent Document 1: Japanese Laid-Open Patent Publication No. 2006-188748

Patent Document 2 Japanese Laid-Open Patent Publication No. 2017-82313

Patent Document 3 Japanese Laid-Open Patent Publication No. 2015-10270

SUMMARY OF INVENTION

Technical Problem

For both of a metal mask and a stack-type mask, the mask substrate is tensioned in order to improve the degree of planeness of the active region formation portion. In the case where the degree of planeness of the active region formation portion is low, namely, in the case where the mask substrate is loose in the active region formation portion, there occurs a gap between the active region formation portion and a surface of the element substrate. This causes a problem that the film is not formed with a predetermined shape.

However, according to the studies made by the present inventors, formation of openings in the tensioned mask substrate causes a problem that the distribution of the direction or the magnitude of a stress in the mask substrate (may be referred to simply as "stress distribution"), which is caused by the formation of the openings, is changed, and as a result, the openings are deformed.

Since the mask substrate is tensioned (receives a tensile force directed outward in the plane), a stress is caused in the mask substrate. The stress is a function of the position in the mask substrate. In other words, the direction or the magnitude of the stress varies in accordance with the position in the mask substrate. The stress distribution of the mask substrate is changed each time an opening is formed in the mask substrate. Therefore, the precision of the position, size and shape of the openings in a final state depends on the order in which the openings are formed. This problem is especially conspicuous in the case where, for example, the openings are formed in a highly precise pattern exceeding 200 ppi.

In a deposition mask usable for a plurality of the active regions, namely, in a deposition mask usable for a mother substrate used to produce a plurality of OLED display devices, the stress distribution in the mask substrate varies in accordance with the position of an active region formation portion of interest. This also causes the above-described problem.

It may be possible to actually form a deposition mask, measure the deviations from the designed values of the position, size and shape of the openings, and then, in consideration of the deviations, form the openings to provide a desired precision. It may also be possible to repeat these steps to provide a desired precision. However, there is a limit on the precision, and such a complicated production process increases the production cost.

The present invention made in order to solve the above-described problem has an object of providing a method for producing a deposition mask including a mask substrate tensioned (e.g., a resin layer and/or a magnetic metal layer), the method suppressing the deformation of openings caused by uneven distribution of the internal stress of the mask substrate.

Solution to Problem

A method for producing a deposition mask in an embodiment according to the present invention is a method for producing a deposition mask including a quadrangular mask substrate secured so as to define an xy plane and a plurality of active region formation portions provided on the mask substrate and arrayed in p rows by q columns, the plurality of active region formation portions each including a plurality of openings arrayed in m rows by n columns. The method includes a step of preparing the mask substrate secured so as to define the xy plane; and an opening formation step of forming the plurality of active region formation portions on the mask substrate. The opening formation step includes step A of forming openings of "a" number of continual columns included in a first region including at least the (n/2)th column or the ((n+1)/2)th column; step B of forming openings of "b" number of continual columns included in a second region adjacent to the first region in a −x direction with a first gap region being sandwiched between the first region and the second region, the first gap region including "sa" number of continual columns; and step C of forming openings of "c" number of continual columns included in a third region adjacent to the first region in an x direction with a second gap region being sandwiched between the first region and the third region, the second gap region including "sb" number of continual columns. The step B and the step C are performed after the step A.

In an embodiment, step D of forming openings in the first gap region, or step E of forming openings in the second gap region, is performed after the step A, the step B and the step C.

In an embodiment, the second region includes the central column in all the regions adjacent to the first region in the −x direction, and the third region includes the central column in all the regions adjacent to the first region in the x direction.

In an embodiment, the opening formation step further includes step F of forming openings of "d" number of continual columns included in a fourth region adjacent to the second region in the −x direction; and step G of forming openings of "e" number of continual columns included in a fifth region adjacent to the third region in the x direction. The step F or the step G is performed after the step A, the step B and the step C.

In an embodiment, the step F and the step G are performed before the step D and the step E.

In an embodiment, the fourth region is not directly adjacent to the second region, and the fifth region is not directly adjacent to the third region.

In an embodiment, the step D is a step of forming the openings of a number, smaller than "sa", of continual columns that include the central column in all the regions located between the first region and the second region, and the step E is a step of forming the openings of a number, smaller than "sb", of continual columns that include the central column in all the regions located between the first region and the third region.

In an embodiment, the fourth region includes the openings of a number, smaller than "d", of continual columns including the central column in all the regions adjacent to the second region in the −x direction; and the fifth region includes the openings of a number, smaller than "e", of continual columns including the central column in all the regions adjacent to the third region in the x direction.

In an embodiment, the opening formation step further includes step F of forming openings of "d" number of continual columns included in a fourth region adjacent to the second region in the −x direction with a third gap region being sandwiched between the second region and the fourth region, the third gap region including "sc" number of continual columns; and step G of forming openings of "e" number of continual columns included in a fifth region adjacent to the third region in the x direction with a fourth gap region being sandwiched between the third region and the fifth region, the fourth gap region including "sd" number of continual columns. The step F or the step G is performed after the step A, the step B and the step C.

In an embodiment, the step F and the step G are performed before the step D and the step E.

In an embodiment, the opening formation step further includes step H of forming openings of "f" number of continual columns included in a sixth region adjacent to the fourth region in the −x direction; and/or step I of forming openings of "g" number of continual columns included in a seventh region adjacent to the fifth region in the x direction.

In an embodiment, the "a", "b", "c", "sa" and "sb" are independently 100 or greater and 300 or less.

In an embodiment, the step B and the step C are performed after the step A for all the active region formation portions of an arbitrary column.

In an embodiment, the opening formation step is performed from the active region formation portions belonging to the (q/2)th column or the {(q+1)/2}th column.

In an embodiment, the opening formation step is performed from the active region formation portions belonging to the (p/2)th row or the {(p+1)/2}th row.

A method for producing a deposition mask in another embodiment according to the present invention is a method for producing a deposition mask including a quadrangular mask substrate secured so as to define an xy plane and a plurality of active region formation portions provided on the mask substrate and arrayed in p rows by q columns, the plurality of active region formation portions each including a plurality of openings arrayed in m rows by n columns. The method includes a step of preparing the mask substrate secured so as to define the xy plane; and an opening formation step of forming the plurality of active region formation portions on the mask substrate. The opening formation step is performed from the active region formation portions belonging to the (p/2)th row or the {(p+1)/2}th row.

In an embodiment, the opening formation step is performed from the active region formation portions belonging to the (q/2)th column or the {(q+1)/2}th column.

In an embodiment, the mask substrate includes a resin layer including the plurality of openings and a magnetic metal layer including at least one through-hole exposing the plurality of openings. At least the resin layer is in an x direction and a y direction.

In an embodiment, the mask substrate includes a magnetic metal layer including the plurality of openings. The magnetic metal layer is tensioned in, for example, only the y direction.

In an embodiment, the mask substrate is of a rectangle longer in the x direction, and the row direction is parallel to the x direction.

The plurality of openings may be, for example, quadrangular (encompassing, for example, rectangular and square), diamond-shaped, circular, elliptical or of any other shape.

Advantageous Effects of Invention

A method for producing a deposition mask including a mask substrate tensioned in an embodiment according to the present invention suppresses the deformation of openings caused by uneven distribution of the internal stress of the mask substrate. Therefore, the method in an embodiment according to the present invention produces a high-definition deposition mask at high precision.

DESCRIPTION OF EMBODIMENTS

Hereinafter, preferred embodiments of the present invention will be described with reference to the accompanying drawings. The present invention is not limited to any of the following embodiments.

First, an example of deposition mask preferably produced by a production method in an embodiment according to the present invention will be described. The production method in an embodiment according to the present invention is not limited to the following deposition mask, and an embodiment according to the present invention is widely applicable to the production of a deposition mask including, for example, formation of openings in a tensioned mask substrate as described in each of Patent Documents 1 through 3. The entirety of Patent Documents 1 through 3 is incorporated herein by reference.

(Structure of the Deposition Mask)

Figure 1:
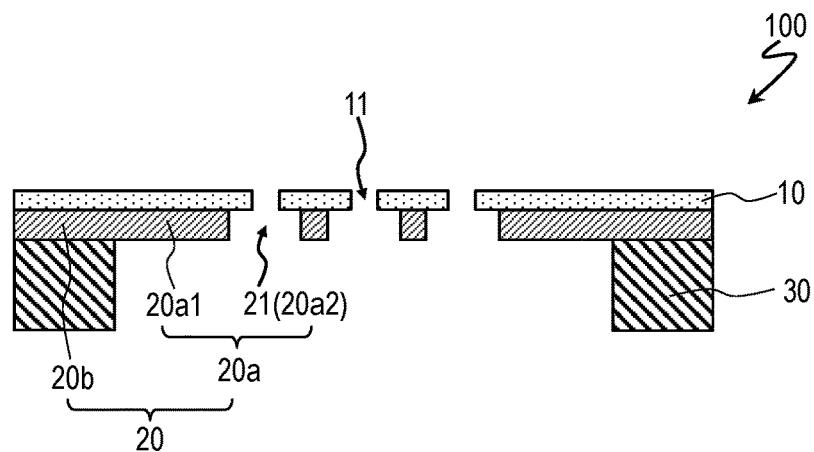
FIG. 1 is a cross-sectional view schematically showing a deposition mask 100 preferably produced by a production method in an embodiment according to the present invention, and shows a cross-section taken along line 1A-1A in FIG. 2.
Figure 2:
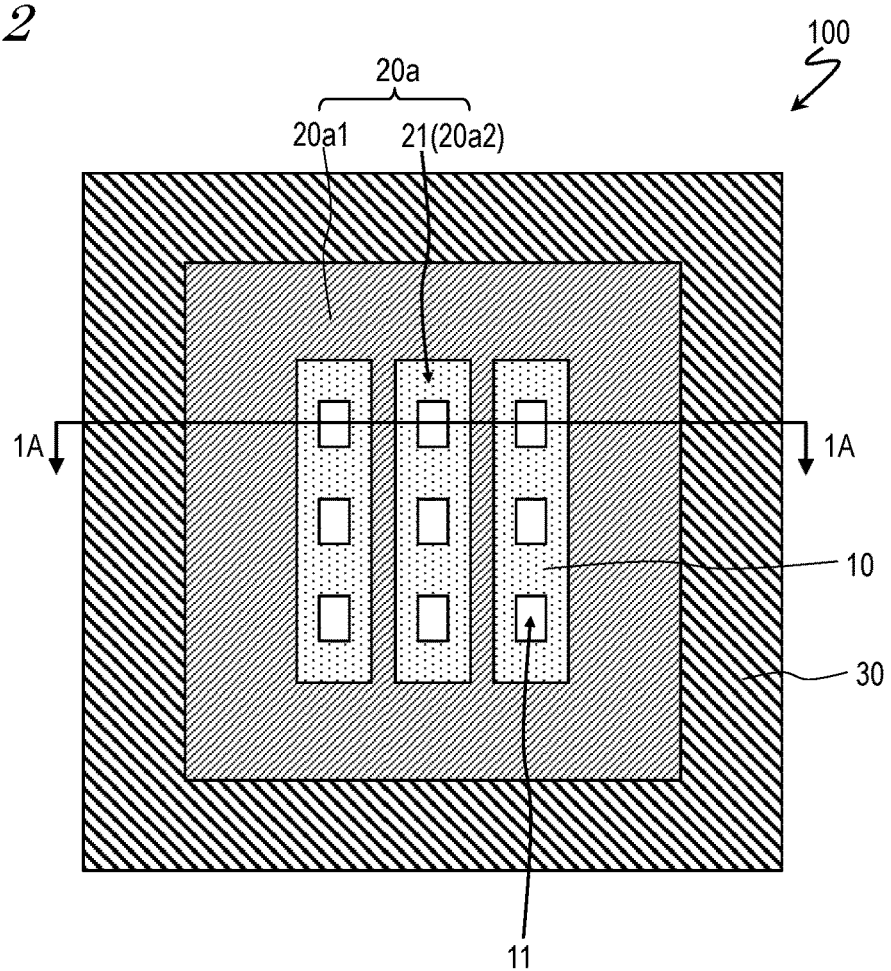
FIG. 2 is a plan view schematically showing the deposition mask 100.

With reference to FIG. 1 and FIG. 2, a structure of a deposition mask 100 preferably produced by a production method in an embodiment according to the present invention will be described. FIG. 1 and FIG. 2 are respectively a cross-sectional view and a plan view schematically showing the deposition mask 100. FIG. 1 shows a cross-section taken along line 1A-1A in FIG. 2. FIG. 1 and FIG. 2 schematically show an example of the deposition mask 100, and the size, number, positional relationship and length ratio of the components are not limited to those shown in the figures, needless to say. This is also applied to the other figures referred to below.

As shown in FIG. 1 and FIG. 2, the deposition mask 100 includes a resin layer 10, a magnetic metal layer 20, and a frame 30. These components of the deposition mask 100 are located such that in a state where the deposition mask 100 is used for a vapor deposition step, the magnetic metal layer 20 is located closer to a vapor deposition source, whereas the resin layer 10 is located closer to a vapor deposition object (element substrate including a backplane).

The resin layer 10 includes a plurality of openings 11. The plurality of openings 11 are formed with the size, shape and positions corresponding to those of a plurality of pixels to be formed on the element substrate (backplane). In the example shown in FIG. 2, the plurality of openings 11 are located in a matrix. The size, shape and positions of the openings 11 may vary in accordance with the color of the organic EL layer to be formed.

The resin layer 10 may be preferably formed of, for example, polyimide. Polyimide has a small coefficient of thermal expansion and is high in strength, chemical resistance and heat resistance. The resin layer 10 may be formed of another resin material such as polyethyleneterephthalate (PET) or the like.

The resin layer 10 is not limited to having any specific thickness. However, if the resin layer 10 is too thick, a part of a vapor-deposited film may be formed to be thinner than a desired thickness (referred to as "shadowing"). From the point of view of suppressing occurrence of the shadowing, it is preferred that the resin layer 10 has a thickness of 25 µm or less. From the point of view of the strength and the washing resistance of the resin layer 10 itself, it is preferred that the resin layer 10 has a thickness of 3 µm or greater.

The magnetic metal layer 20 is formed on the resin layer 10. The magnetic metal layer 20 is formed on the resin layer 10 by, for example, plating as described below. The magnetic metal layer 20 adheres to the resin layer 10. The magnetic metal layer 20 includes a mask portion 20a and a peripheral portion 20b located to enclose the mask portion 20a. The mask portion 20a refers to a portion of the magnetic metal layer 20 corresponding to an active region formation portion.

The mask portion 20a includes a plurality of through-holes (slits) 21 exposing the plurality of openings 11 of the resin layer 10. In the example shown in FIG. 2, the plurality of through-holes 21 extending in a column direction are arrayed in a row direction. As seen from the direction of normal to the deposition mask 100, the through-holes 21 each have a size larger than that of each of the openings 11 of the resin layer 10, and at least one opening 11 (a plurality of openings 11 in this example) is located in each of the through-holes 21. In this specification, a region 20a1, of the mask portion 20a, in which a metal film is present will be referred to as a "solid portion", and regions 20a2 in which no metal film is present (in this example, these portions are the through-holes 21) will be referred to as non-solid portions.

The magnetic metal layer 20 is formed by, for example, electroless plating or electrolytic plating. The magnetic metal layer 20 is preferably a nickel (Ni)-plated layer or a nickel alloy-plated layer. It is preferred that the resin layer 10 is formed of polyimide and that the coefficient of thermal expansion of the magnetic metal layer 20 is matched to that of the resin layer 10.

The magnetic metal layer 20 is not limited to having any specific thickness. However, if the magnetic metal layer 20 is too thick, the magnetic metal layer 20 may be sagged by its own weight or may cause shadowing. From the point of view of suppressing the sagging due to its own weight or suppressing occurrence of the shadowing, it is preferred that the magnetic metal layer 20 has a thickness of 100 µm or less. If the magnetic metal layer 20 is too thin, the attraction strength of a magnetic chuck is low in the vapor deposition step described below, which may cause a gap between the deposition mask 100 and a work. In addition, the magnetic metal layer 20 may be ruptured or deformed, which may make magnetic metal layer 20 difficult to be handled. Therefore, it is preferred that the magnetic metal layer 20 has a thickness of 5 µm or greater.

The frame 30 is frame-shaped, and is secured to the peripheral portion 20b of the magnetic metal layer 20. Namely, a region of the magnetic metal layer 20 that does not overlap the frame 30 is the mask portion 20a, and a region of the magnetic metal layer 20 that overlaps the frame 30 is the peripheral portion 20b. The frame 30 is formed of, for example, a metal material. It is preferred that the frame 30 is formed of a magnetic metal material having a small linear thermal expansion coefficient αM (specifically, less than 6 ppm/° C.). It is preferred that the frame 30 may be formed of, for example, an Fe—Ni-based alloy (invar), an Fe—Ni—Co-based alloy or the like.

As shown in FIG. 1, the magnetic metal layer 20 is joined to the resin layer 10 in the entirety of the deposition mask 100. The resin layer 10 and the magnetic metal layer 20 receive a tensile force in an in-plane direction of the layers from the frame 30. As described below, in a tensioning step, the resin layer 10 and the magnetic metal layer 20 are secured to the frame 30 in a state of being pulled in a predetermined in-planer direction by a tension machine (or a tension welding machine having a welding function).

(Method for Producing the Deposition Mask)

With reference to FIG. 3(a) through FIG. 3(f), an example of method for producing the deposition mask 100 will be described. FIG. 3(a) through FIG. 3(f) are each a cross-sectional view showing a production step of the deposition mask 100.

First, as shown in FIG. 3(a), a resin sheet formed of a resin material is prepared as the resin layer 10. As the material of the resin layer 10, polyimide, for example, is preferably usable.

Next, as shown in FIG. 3(b), a resist layer 32 having a pattern is formed on the resin layer 10. The resist layer 32 is formed so as to correspond to the through-holes 21 of the magnetic metal layer 20.

Next, as shown in FIG. 3(c), the magnetic metal layer 20 is formed. The magnetic metal layer 20 is formed by electroless plating or electrolytic plating. Before the plating step, a catalyst layer and/or an underlying layer (seed layer) may be formed.

Next, as shown in FIG. 3(d), the resist layer 32 is removed, so that the through-holes 21 are formed in the magnetic metal layer 20. The magnetic metal layer 20 includes the mask portion 20a including the solid portion 20a1 and the non-solid portions 20a2, and the peripheral portion 20b located to enclose the mask portion 20a.

Next, as shown in FIG. 3(e), the resin layer 10 and the peripheral portion 20b of the magnetic metal layer 20 are secured to the frame 30. This step is performed in a state where the resin layer 10 and the magnetic metal layer 20 are supplied with a tensile force in an in-plane direction from outside. First, the frame 30 is secured to the tension welding machine. Next, the resin layer 10 and the magnetic metal layer 20 are placed on the frame 30, with the magnetic metal layer 20 being a lower layer. Next, two edges facing each other of the resin layer 10 and the magnetic metal layer 20 (edges perpendicular to a first direction X in the figure) are held by a holding portion (clamp) of the tension welding machine, and a certain tensile force is supplied in a direction parallel to the first direction X. At the same time, two edges perpendicular to a second direction Y perpendicular to the first direction X (namely, edges parallel to the first direction X) are also held by the clamp, and a certain tensile force is supplied in a direction parallel to the second direction Y.

In this state, laser light L1 is directed from a region outer to the resin layer 10 to weld the resin layer 10 and the peripheral portion 20b of the magnetic metal layer 20 to the frame 30. In this example, spot welding is performed at a plurality of positions with a predetermined interval. The pitch of the spot welding may be selected optionally. Welding may be performed by use of, for example, a YAG laser. The laser light L1 has a wavelength of, for example, 1064 nm and an energy per pulse of, for example, 7J/pulse. Needless to say, the welding conditions are not limited to those described herein.

Next, as shown in FIG. 3(f), the plurality of openings 11 are formed in the resin layer 10. In this step, the plurality of openings 11 are formed in regions of the resin layer 10 that correspond to the non-solid portions 20a2 of the mask portion 20a. The openings 11 may be formed by, for example, laser processing. The laser processing is performed by use of, for example, a pulse laser. In this example, a YAG laser is used, and laser light L2 having a wavelength of 355 nm is directed toward predetermined regions of the resin layer 10. Before this step, the processing object (structural body including the frame 30, the magnetic metal layer 20 and the resin layer 10) is put upside down such that the laser light L2 is directed downward. The laser light L2 has an energy density of, for example, 0.5 $J/cm^2$. The laser processing is performed by providing a shot a plurality of times while the laser light L2 is focused on a surface of the resin layer 10. The number of times of the shot is determined in accordance with the thickness of the resin layer 10. The frequency of the shot is set to, for example, 60 Hz. In this manner, the deposition mask 100 is produced.

The conditions of the laser processing are not limited to those described above, and any conditions may be optionally selected such that the resin layer 10 may be processed. For example, laser light having a large beam diameter may be prepared and may be directed via a photomask having openings corresponding to, for example, 50×50 openings 11 or 100×100 openings 11, so that the openings 11 may be formed block by block. In this case, a mask substrate in which the openings 11 are formed is moved discontinuously like a stepper.

(Modifications of the Deposition Mask)

In the deposition mask 100 shown in FIG. 1 and FIG. 2, a plurality of openings 11 of the resin layer 10 are arrayed in one line in each of the through-holes 21 of the magnetic metal layer 20. The structure of the through-holes 21 of the magnetic metal layer 20 is not limited to this. For example, a plurality of openings 11 of the resin layer 10 may be arrayed in a matrix in each of the through-holes 21. The plurality of through-holes 21 may be arrayed parallel to each other in the column direction or may be arrayed in a matrix.

Alternatively, one opening 11 of the resin layer 10 may be located in each of the through-holes 21 of the magnetic metal layer 20. It is sufficient that at least one opening 11 is located in each of the through-holes 21 of the magnetic metal layer 20.

Still alternatively, the magnetic metal layer 20 includes one through-hole 21. It is sufficient that the mask portion 20a of the magnetic metal layer 20 includes at least one through-hole 21.

The resin layer 10 and the magnetic metal layer 20 may be joined to the frame 30 by use of an adhesive instead of welding. The adhesive may be of an ultraviolet-curable type or a thermally curable type. It is preferred to use an adhesive causing as little outgassing as possible.

(Order in Which the Openings Are Formed)

Hereinafter, with reference to FIG. 4 through FIG. 12, the order in which openings are formed in an active region formation portion in a method for producing a deposition mask in an embodiment according to the present invention will be described. In the method for producing a deposition mask in an embodiment according to the present invention, the openings are formed in such an order that decreases the degree of unevenness of the distribution of the internal stress (tensile force), which is caused in the mask substrate by the formation of the openings in the tensioned mask substrate (the resin layer and/or the magnetic metal layer). With such an order, the deformation of the openings caused by the uneven distribution of the internal stress is suppressed.

Conventionally, the openings are formed sequentially and continually from an end (one point) of the active region formation portion of the mask substrate, in order to improve the throughput of the laser processing. The openings are formed in this manner in order to minimize the time required to move the mask substrate with respect to the laser. The stress distribution of the mask substrate is changed each time an opening is formed in the mask substrate. Therefore, in the case where the openings are formed continually from one end to the other end, the distribution of the internal stress (tensile force) caused by the formation of the openings becomes uneven, and the shape of the openings is deviated largely. It may be possible to produce a preparatory deposition mask, measure the deviations from the designed values, and then, in consideration of the deviations, form the openings, to provide a desired precision. It may also be possible to repeat these steps to provide a desired precision. Such steps need to be repeated many times in order to produce a high-definition deposition mask, which raises the production cost. Especially, a high-definition deposition mask exceeding 400 ppi is difficult to be produced.

According to the method for producing a deposition mask in an embodiment according to the present invention, the throughput of the laser processing is sacrificed in order to decrease the degree of unevenness of the distribution of the internal stress (tensile force), which is caused in the mask substrate by the formation of the openings. The method for producing a deposition mask in an embodiment according to the present invention is suitable to the production of a high-definition deposition mask.

Figure 4:
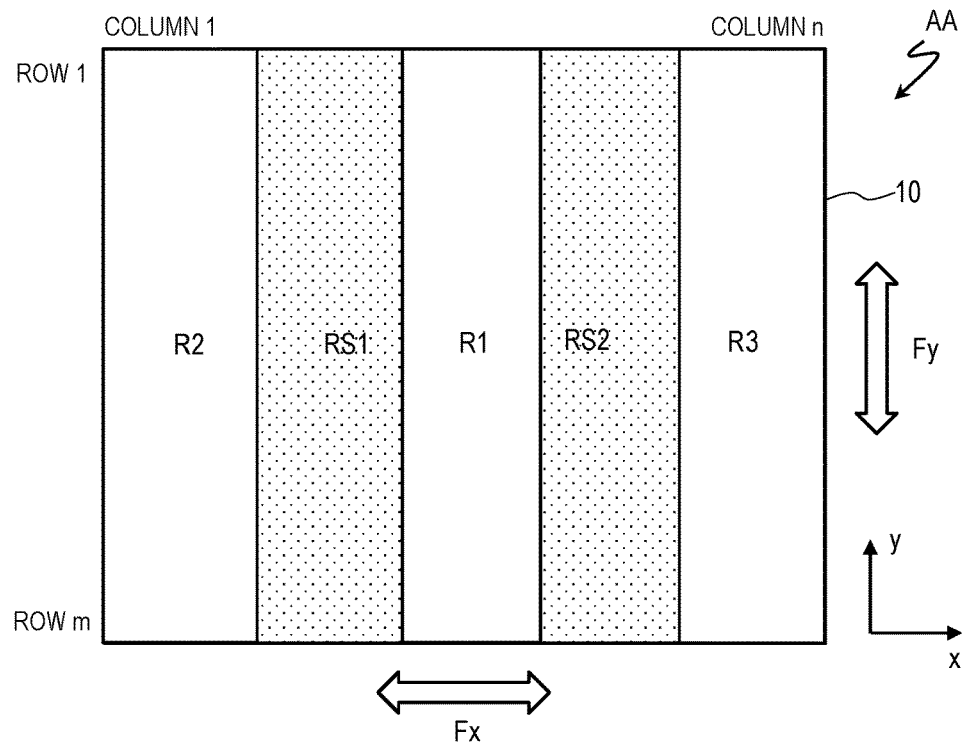
FIG. 4 is a schematic plan view of a mask substrate and is provided to illustrate an order in which openings are formed in an active region formation portion in a method for producing a deposition mask (stack-type mask) in an embodiment according to the present invention.
Figure 5:
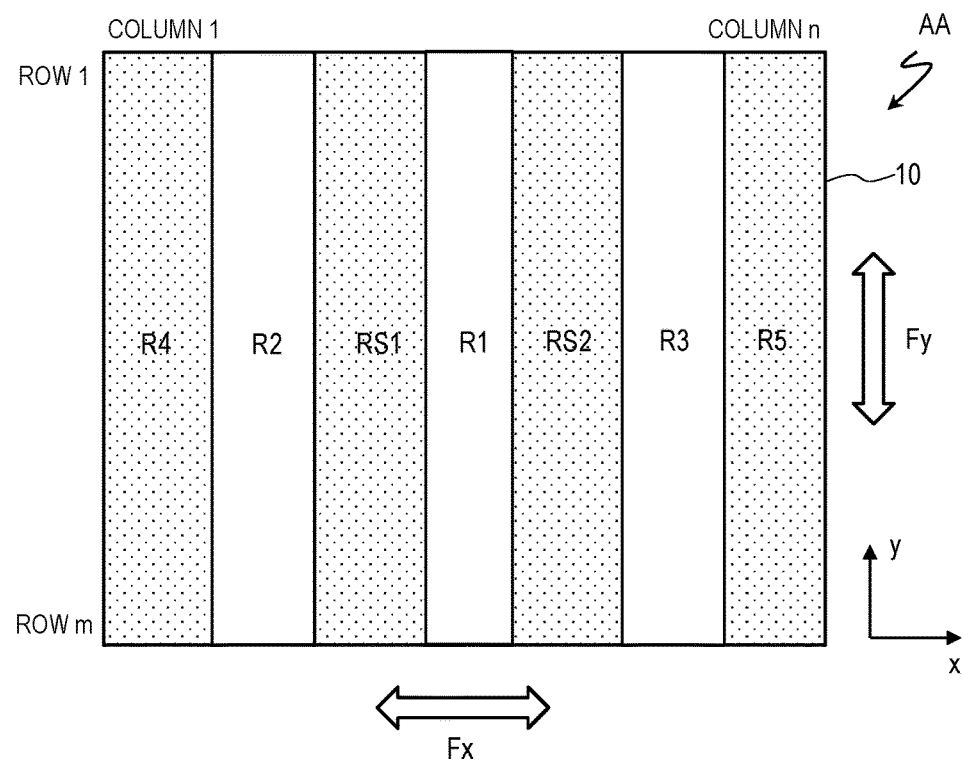
FIG. 5 is a schematic plan view of a mask substrate and is provided to illustrate an order in which openings are formed in an active region formation portion in a method for producing a deposition mask (stack-type mask) in another embodiment according to the present invention.

FIG. 4 and FIG. 5 will be referred to. FIG. 4 is a schematic plan view of a mask substrate and is provided to illustrate the order in which openings are formed in an active region formation portion in a method for producing a deposition mask (stack-type mask) in an embodiment according to the present invention. FIG. 5 is a schematic plan view of a mask substrate and is provided to illustrate the order in which openings are formed in an active region formation portion in a method for producing a deposition mask (stack-type mask) in another embodiment according to the present invention.

In general, a deposition mask includes a plurality of active region formation portions AA in correspondence with a plurality of active regions of a mother substrate usable to produce a plurality of OLED display devices. The plurality of active region formation portions AA are generally arrayed in p rows by q columns (see, for example, FIG. 10 through FIG. 12). FIG. 4 and FIG. 5 each show the resin layer 10 in one active region formation portion AA, and each show regions (R1, R2, R3 and the like) in which the openings (not shown) are to be formed. In FIG. 4 and FIG. 5, the regions are shown with hatching and without hatching in order to make the regions easy to see (this is also applied to FIG. 6 through FIG. 9). As described above with reference to FIG.

Figure 3:
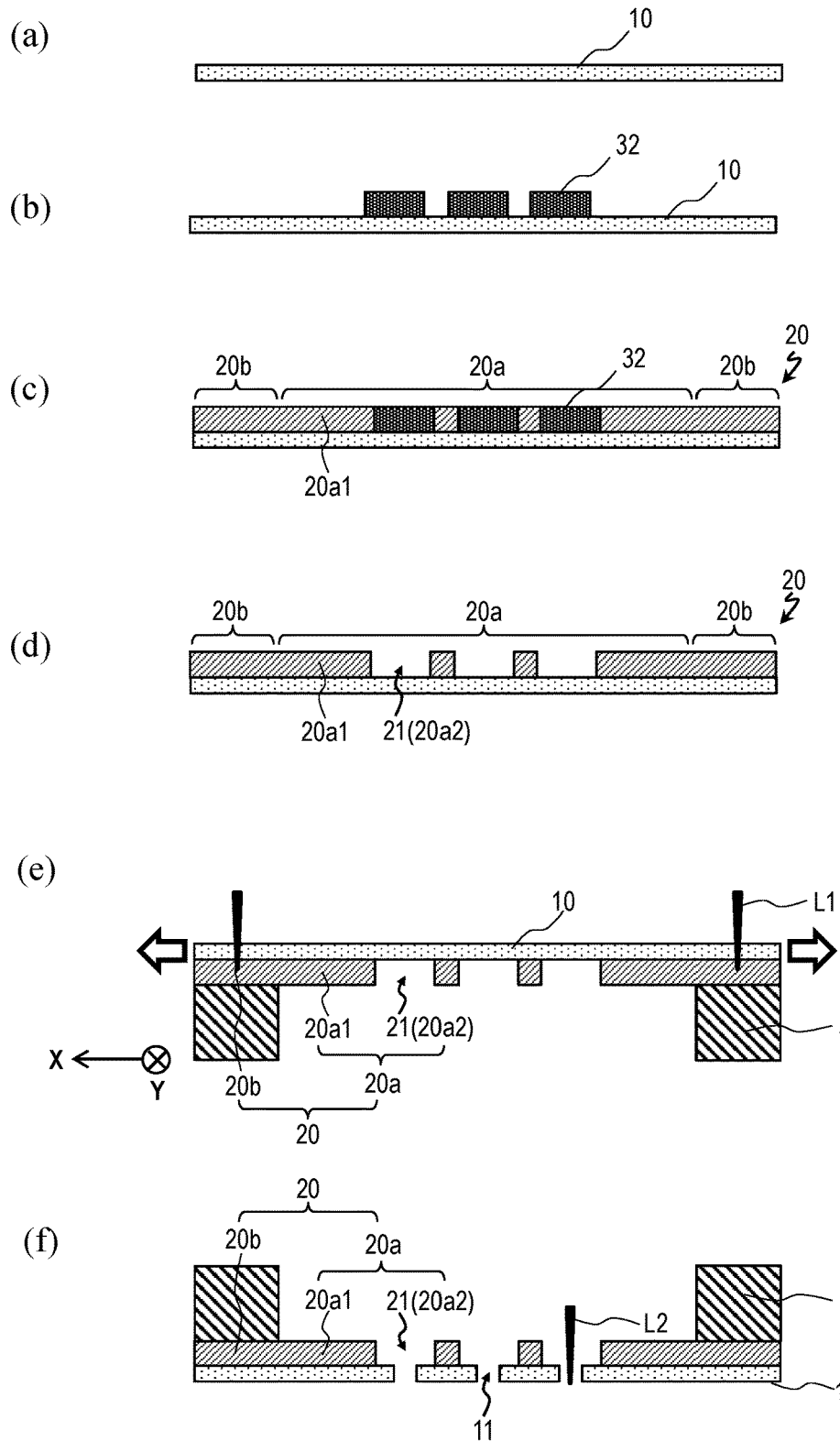
FIG. 3(a) through FIG. 3(f) are each a schematic cross-sectional view showing a production step of the deposition mask 100.

1 through FIG. 3, the mask substrate of the stack-type mask includes the resin layer 10 and the magnetic metal layer 20. Since the plurality of openings 11 are formed in the resin layer 10, the magnetic metal layer 20 will be omitted in the figures referred to hereinafter.

As described above with reference to FIG. 3, the resin layer 10 is secured to the frame in a state of being tensioned. Now, a plane defined by the tensioned resin layer 10 is defined as an "xy plane". The resin layer 10 is pulled in the x direction by a tensile force Fx, and is pulled in the y direction perpendicular to the x direction by a tensile force Fy. In a state where the resin layer 10 is in this manner, the plurality of openings are formed in a matrix of m rows by n columns. m×n is, for example, 1440×2880. Dummy pixels may be provided in addition to the pixels used for display. In such a case, m and/or n may be an odd number.

In the example described below, the active region formation portion AA is of a rectangle longer in the x direction, and the row direction is parallel to the x direction. The active region formation portion AA is not limited to this, needless to say. The following description may be changed such that the row and the column are replaced with each other, such that the x direction and the −x direction are replaced with each other, or such that the y direction and the −y direction are replaced with each other.

According to the production method in an embodiment according to the present invention, the active region formation portion AA is divided into a plurality of regions, and openings are formed in each of the plurality of regions. In each of the divided regions, the openings may be formed continually. However, it should be avoided to form the openings continually across the plurality of regions. Thus, the openings are formed in the regions discontinuously located. It is preferred that the discontinuously located regions are line-symmetrical with respect to, for example, the center of the active region formation portion AA (in the following example, the center in the x direction). It is preferred that the openings are formed continually in the regions located line-symmetrically. A reason for this is that it is preferred to solve the unevenness of the stress distribution caused by the formation of the openings in as short a time as possible. Needless to say, it is preferred that the regions located line-symmetrically have an equal area size to each other.

FIG. 4 will be referred to.

First, in initial step A, openings of "a" number of continual columns in a first region R1 including at least the (n/2)th column or the {(n+1)/2}th column are formed. Namely, openings are formed in the first region R1 including the central column among "n" number of columns. It is preferred that the first region R1 is line-symmetrical with respect to the (n/2)th column or the {(n+1)/2}th column.

Next, in step B or step C, openings are formed in a second region R2 or in a third region R3, which are not directly adjacent to the first region R1. The second region R2, for example, is adjacent to the first region R1 in the −x direction with a first gap region RS1 being sandwiched between the first region R1 and the second region R2, and includes openings of "b" number of continual columns. The first gap region RS1 includes "sa" number of continual columns. The third region R3, for example, is adjacent to the first region R1 in the x direction with a second gap region RS2 being sandwiched between the first region R1 and the third region R3, and includes openings of "c" number of continual columns. The second gap region RS2 includes "sb" number of continual columns. It is preferred that b and c are equal to each other, and that sa and sb are equal to each other. The number of the columns, i.e., n, is large. Therefore, needless to say, even if b and c are slightly different from each other, or even if sa and sb are slightly different from each other, the evenness of the stress distribution (degree of line-asymmetry) is not much influenced. It is preferred that the difference between b and c, and the difference between sa and sb, is each about 10% or less. These are applied to other regions described below.

After the above-described steps, step D of forming the openings in the first gap region RS1 or step E of forming the openings in the second gap region RS2 is performed.

The openings are formed in this order, so that the unevenness of the change in the stress distribution caused by the formation of the openings is suppressed.

In each of the regions, the openings may be formed continually from one end to the other end in the shortest possible distance as if a letter was written with a single stroke of a brush. It is preferred that the numbers of the columns in the regions (a, b, c, sa and sb) are independently 100 or greater and 300 or less. In other words, the number of the regions may be increased such that the number of the columns in each region is 100 or greater and 300 or less. In the case where the number of the columns is 4096 (resolution: 4K), the active region formation portion AA may be divided into 15 regions, so that the unevenness of the change in the stress distribution caused by the formation of the openings is suppressed. It is preferred that the regions include a generally equal number of columns (a, b, c, sa, and sb). It should be noted that the number "a" of the columns in the first region R1 at the center, in which the openings are first formed, may be smaller than the other numbers.

In the case where, for example, seven regions are formed as shown in FIG. 5, the second region R2 is formed so as to include the central column in all the regions adjacent to the first region R1 in the −x direction, and the third region R3 is formed so as to include the central column in all the regions adjacent to the first region R1 in the x direction. Herein, the "central column" in a region is defined as follows. It is now assumed that the number of columns included in the region is k. In the case where k is an even number, the central column is the (k/2)th column. In the case where k is an odd number, the central column is the {(k+1)/2}th column. The direction of counting may be the x direction or the -x direction.

In this manner, the first region R1 is formed at the center of the active region formation portion AA, the second region R2 is formed at the center of the remaining regions (all the regions in which the openings are to be formed) adjacent to the first region R1 in the −x direction, and the third region R3 is formed at the center of the remaining regions (all the regions in which the openings are to be formed) adjacent to the first region R1 in the x direction. With such an arrangement, the unevenness of the change in the stress distribution caused by the formation of the openings is effectively suppressed.

After the above-described steps, step F of forming openings of "d" number of continual columns included in a fourth region R4 adjacent to the second region R2 in the −x direction, and step G of forming openings of "e" number of continual columns included in a fifth region R5 adjacent to the third region R3 in the x direction, are performed. It is preferred that d and e are each generally equal to a, b, c, sa and sb. It is preferred that step F and step G are performed before step D and step E. In the case where step D and step E are performed first, the openings are formed in one continuous region including the first region R1, the second region R2, the third region R3, the first gap region RS1 and the second gap region RS2. By contrast, in the case where step F and step G are performed first, the openings are formed in three discontinuous regions, namely, the first region R1, the second region R2 and the fourth region R4, and the third region R3 and the fifth region R5. Therefore, the effect of suppressing the eccentricity of the stress distribution is larger.

Figure 6:
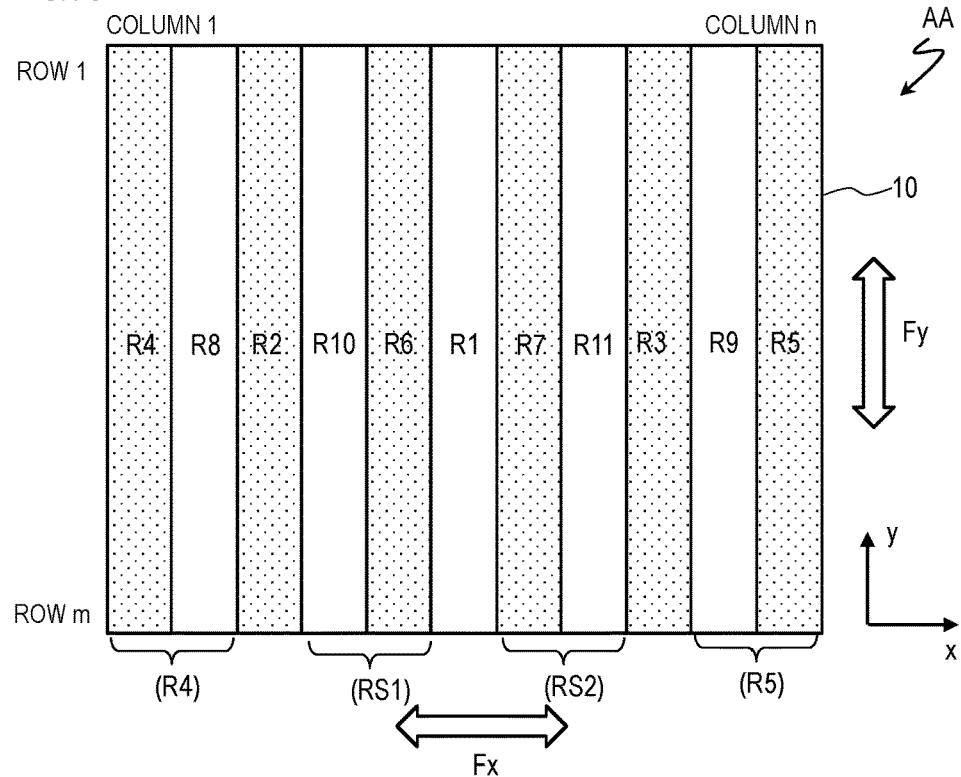
FIG. 6 is a schematic plan view of a mask substrate and is provided to illustrate an order in which openings are formed in an active region formation portion in a method for producing a deposition mask (stack-type mask) in still another embodiment according to the present invention.

Now, FIG. 6 will be referred to.

FIG. 6 shows a case where the active region formation portion AA is divided into 11 regions. In FIG. 6, (R4), (RS1), (RS2) and (R5) at the bottom respectively correspond to the fourth region R4, the first gap region RS1, the second gap region RS2 and the fifth region R5 shown in FIG. 5. Namely, in an opening formation step of dividing the active region formation portion AA into seven regions described above with reference to FIG. 5, the fourth region R4, the first gap region RS1, the second gap region RS2 and the fifth region R5 are each further divided into two regions, so that the active region formation portion AA is divided into 11 regions shown in FIG. 6.

The order in which the openings are formed in FIG. 6 may be, for example, an ascending order of the numerals from the first region R1 to an eleventh region R11 shown in FIG. 6. The opening formation step described above with reference to FIG. 5 is changed as follows. The fourth region R4 is formed as a region not directly adjacent to the second region R2, so that an eighth region R8 is formed. The fifth region R5 is formed as a region not directly adjacent to the third region R3, so that a ninth region R9 is formed. It is preferred that the fourth region R4 and the eighth region R8 include a generally equal number of columns, and that the fifth region R5 and the ninth region R9 include a generally equal number of columns.

Openings are formed in a region, in the first gap region RS1, that is directly adjacent to the first region R1, so that a sixth region R6 is formed. A region, in the first gap region RS1, that is not the sixth region R6 is a tenth region R10. Next, openings are formed in a region, in the second gap region RS2, that is directly adjacent to the first region R1, so that a seventh region R7 is formed. A region, in the second gap region RS2, that is not the seventh region R7 is the eleventh region R11. It is preferred that the sixth region R6 and the tenth region R10 include a generally equal number of columns, and that the seventh region R7 and the eleventh region R11 include a generally equal number of columns.

Figure 7:
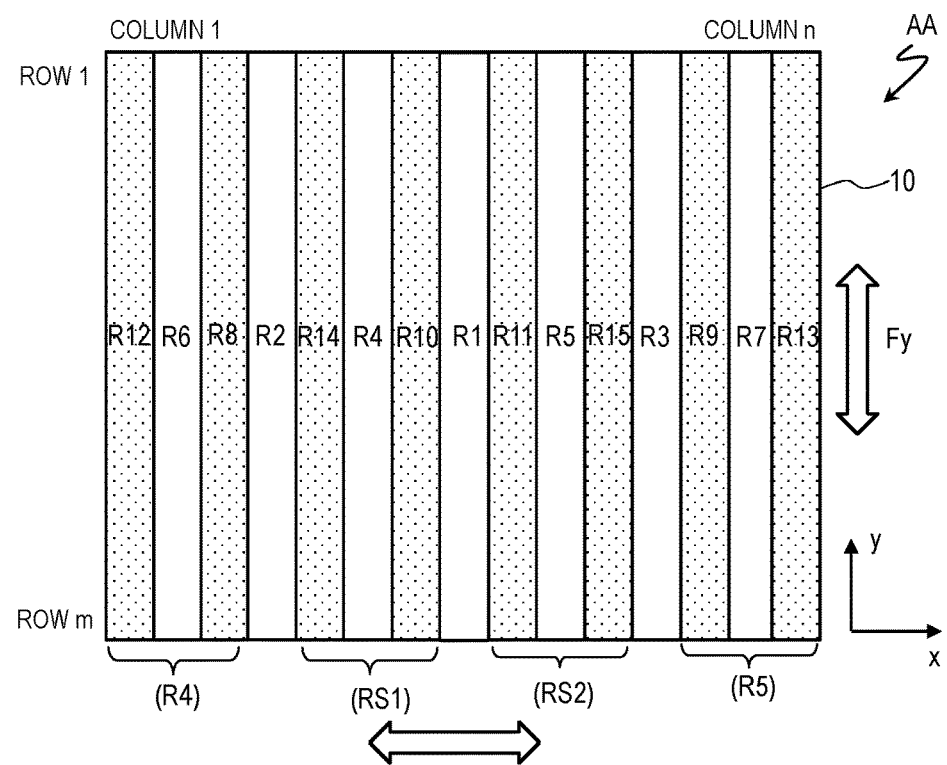
FIG. 7 is a schematic plan view of a mask substrate and is provided to illustrate an order in which openings are formed in an active region formation portion in a method for producing a deposition mask (stack-type mask) in still another embodiment according to the present invention.

Now, FIG. 7 will be referred to.

FIG. 7 shows a case where the active region formation portion AA is divided into 15 regions. In FIG. 7, (R4), (RS1), (RS2) and (RS) at the bottom respectively correspond to the fourth region R4, the first gap region RS1, the second gap region RS2 and the fifth region R5 shown in FIG. 5. Namely, in the opening formation step of dividing the active region formation portion AA into seven regions described above with reference to FIG. 5, the fourth region R4, the first gap region RS1, the second gap region RS2 and the fifth region R5 are each further divided into three regions, so that the active region formation portion AA is divided into 15 regions shown in FIG. 7.

The order in which the openings are formed in FIG. 7 may be, for example, an ascending order of the numerals from the first region R1 to a fifteenth region R15 shown in FIG. 7.

The opening formation step described above with reference to FIG. 5 is changed as follows. In step D, openings of the continual columns, of a number smaller than sa, that include the central column in all the regions located between the first region R1 and the second region R2 are formed. In step E, openings of the continual columns, of a number smaller than sb, that include the central column in all the regions located between the first region R1 and the third region R3 are formed. In step D, the openings are formed so as to generally equally divide the columns included in the first gap region RS1 in FIG. 5 into three (fourth region R4 in FIG. 7). In step E, the openings are formed so as to generally equally divide the columns included in the second gap region RS2 in FIG. 5 into three (fifth region R5 in FIG. 7).

Next, the opening formation step described above with reference to FIG. 5 is changed as follows. The fourth region R4 is formed so as to include openings of the continual columns, of a number smaller than d, that include the central column in all the regions adjacent to the second region R2 in the −x direction. The fifth region R5 is formed so as to include openings of the continual columns, of a number smaller than e, that include the central column in all the regions adjacent to the third region R3 in the x direction. The openings are formed so as to generally equally divide the columns included in the fourth region R4 in FIG. 5 into three (sixth region R6 in FIG. 7). The openings are formed so as to generally equally divide the columns included in the fifth region R5 in FIG. 5 into three (seventh region R7 in FIG. 7).

Now, examples of the order in which the openings are formed will be described with reference to FIG. 8 and FIG. 9. In the example described above with reference to FIG. 6 and FIG. 7, the first region R1 is formed at the center of the active region formation portion AA, and then the second region R2 is formed at the center of the remaining regions adjacent to the first region R1 in the −x direction (regions in which the openings are to be formed) and the third region R3 is formed at the center of the remaining regions adjacent to the first region R1 in the x direction (regions in which the openings are to be formed). Then, in the example shown in FIG. 7, the fourth region R4 and the seventh region R7 are formed at the center of the regions still remaining after the above-described steps. By contrast, in the example shown in FIG. 8 and FIG. 9, the openings are formed as follows after the first region R1 is formed at the center of the active region formation portion AA. The second region R2 is formed away from the first region R1 in the 31 x direction by a certain number of columns (gap region), and the third region R3 is formed away from the first region R1 in the x direction by a certain number of columns (gap region). Then, the fourth region R4 is formed away from the second region R2 in the 31 x direction by a certain number of columns (gap region), and the fifth region R5 is formed away from the third region R3 in the x direction by a certain number of columns (gap region). In this manner, the openings may be formed away from the center in the x direction and the −x direction by a certain number of columns (gap regions).

Figure 8:
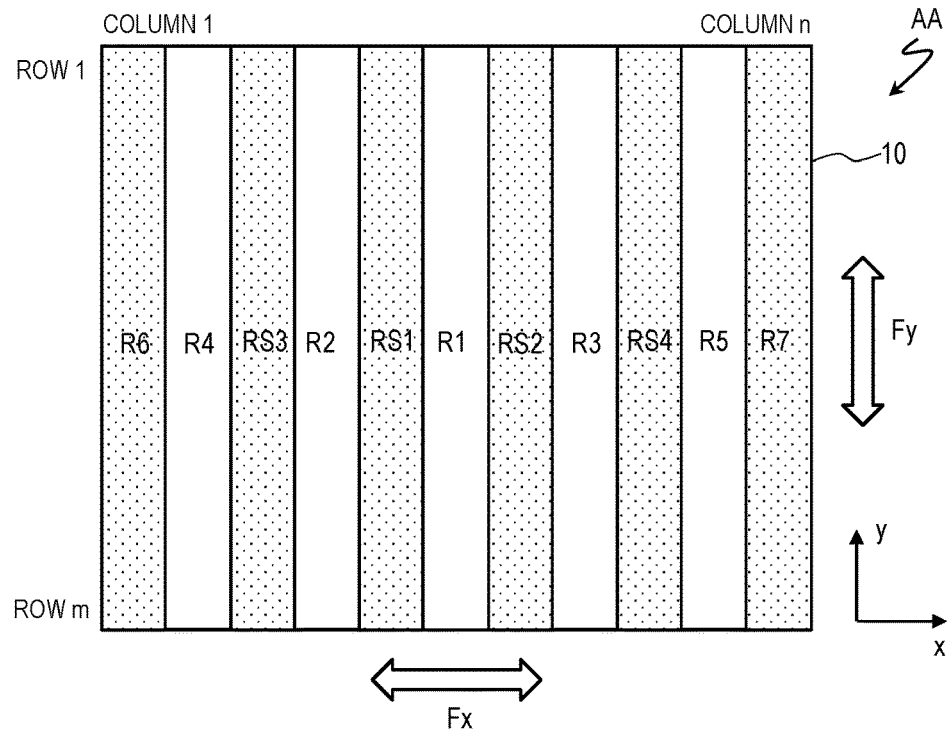
FIG. 8 is a schematic plan view of a mask substrate and is provided to illustrate an order in which openings are formed in an active region formation portion in a method for producing a deposition mask (stack-type mask) in still another embodiment according to the present invention.
Figure 9:
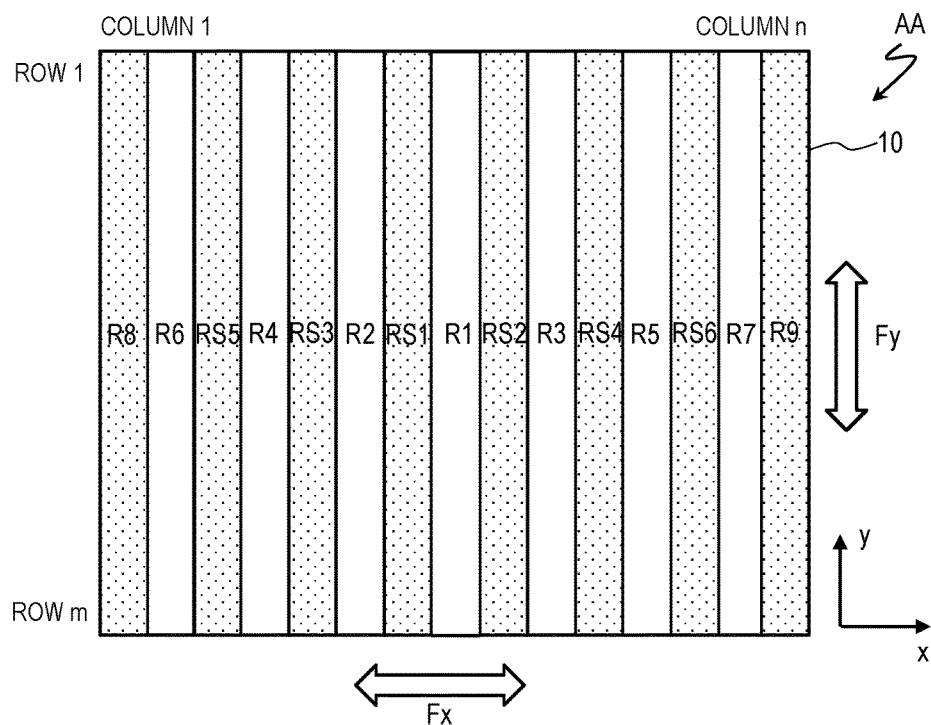
FIG. 9 is a schematic plan view of a mask substrate and is provided to illustrate an order in which openings are formed in an active region formation portion in a method for producing a deposition mask (stack-type mask) in still another embodiment according to the present invention.

FIG. 8 shows a case where the active region formation portion AA is divided into 11 regions like in FIG. 6. FIG. 9 shows a case where the active region formation portion AA is divided into 15 regions like in FIG. 7.

First, the first region R1, the second region R2 and the third region R3 are formed in the same order as described above with reference to FIG. 5. Namely, step A, step B and step C are performed. The numbers of the columns included in the first gap region RS1 and the second gap region RS2 formed in these steps are different from those in the case of FIG. 5.

Then, step F of forming openings of "d" number of continual columns included in the fourth region R4 adjacent to the second region R2 in the −x direction with a third gap region RS3 being sandwiched between the second region R2 and the fourth region R4, and step G of forming openings of "e" number of continual columns included in the fifth region R5 adjacent to the third region R3 in the x direction with a fourth gap region RS4 being sandwiched between the third region R3 and the fifth region R5, are performed. The third gap region RS3 includes "sc" number of continual columns, and the fourth gap region RS4 includes "sd" number of continual columns.

Then, step H of forming openings of "f" number of continual columns included in the sixth region R6 adjacent to the fourth region R4 in the −x direction, and/or step I of forming openings of "g" number of continual columns included in the seventh region R7 adjacent to the fifth region R5 in the x direction, are performed.

The sixth region R6 is formed so as to be directly adjacent to the fourth region R4, and the seventh region R7 is formed so as to be directly adjacent to the fifth region R5, so that the first region R1 through the seventh region R7 shown in FIG. 8 are provided. It is preferred that after the openings are formed in the first through seventh regions R1 through R7, the openings are formed in the first gap region RS1 and the second gap region RS2, and then the openings are formed in the third gap region RS3 and the fourth gap region RS4. A reason for this is that the effect of suppressing the unevenness of the change in the stress distribution is larger in the case where the regions in which the openings are formed are more dispersed.

Alternatively, the sixth region R6 may be formed so as to be adjacent to the fourth region R4 with a fifth gap region RS5 being sandwiched between the fourth region R4 and the sixth region R6, the seventh region R7 may be formed so as to be adjacent to the fifth region R5 with a sixth gap region RS6 being sandwiched between the fifth region R5 and the seventh region R7, the eighth region R8 may be formed so as to be directly adjacent to the sixth region R6, and the ninth region R9 may be formed so as to be directly adjacent to the seventh region R7. In this manner, the first region R1 through the ninth region R9 shown in FIG. 9 are provided. It is preferred that after the openings are formed in the first through ninth regions R1 through R9, the openings are formed in the first gap region RS1 and the second gap region RS2, then the openings are formed in the fifth gap region RS5 and the sixth gap region RS6, and then the openings are formed in the third gap region RS3 and the fourth gap region RS4. A reason for this is that the effect of suppressing the unevenness of the change in the stress distribution is larger in the case where the regions in which the openings are formed are more dispersed.

In a deposition mask usable for a mother substrate usable to produce a plurality of OLED display devices, the stress distribution in the mask substrate varies in accordance with the position of an active region formation portion of interest. This also causes the above-described problem. Thus, with reference to FIG. 10 through FIG. 12, the order in which the openings are formed in the plurality of active region formation portions AA will be described.

Figure 10:
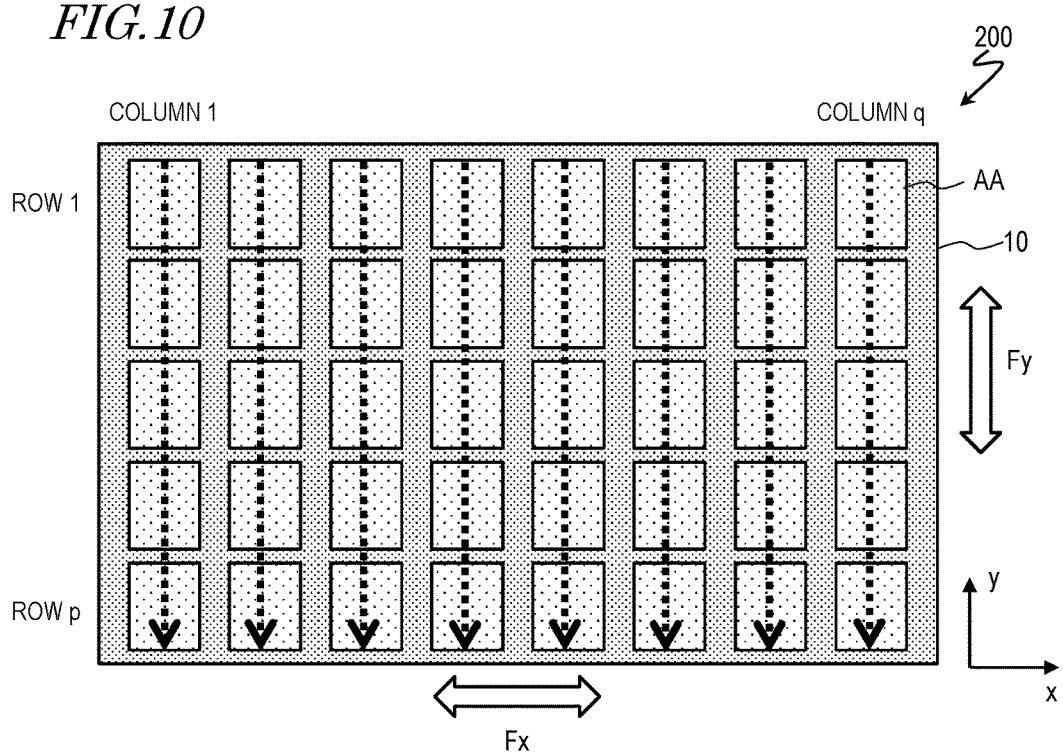
FIG. 10 is a schematic plan view of a mask substrate and is provided to illustrate an order in which openings are formed in a plurality of active region formation portions in a method for producing a deposition mask (stack-type mask) usable to produce a plurality of devices in still another embodiment according to the present invention.

A deposition mask 200 for a mother substrate shown in FIG. 10 includes a plurality of active region formation portions AA arrayed in p rows by q columns. p and q are each, for example, about 40 to about 100.

As represented by the arrows in FIG. 10, step A is performed and then step B, step C and the like are performed for all the active region formation portions AA in arbitrary columns. Namely, the steps of forming the openings are not performed for the active region formation portions AA one by one, but the opening formation step is performed in the above-described order for the active region formation portions AA belonging to each column. In this manner, the moving distance in the y direction is shortened, and the change in the stress distribution in the y direction is suppressed.

It is preferred that the order in which the active region formation portions AA are selected may be the same as the above-described order in which the columns of the openings are selected. Namely, n columns described above may be replaced with q columns. Specifically, the opening formation step may start with the active region formation portions AA belonging to the (q/2)th column or the {(q+1)/2}th column. Alternatively, in the case where the row and the column are replaced with each other such that the openings are formed in the row direction, the opening formation step may start with the active region formation portions AA belonging to the (p/2)th row or the {(p+1)/2}th row.

Figure 11:
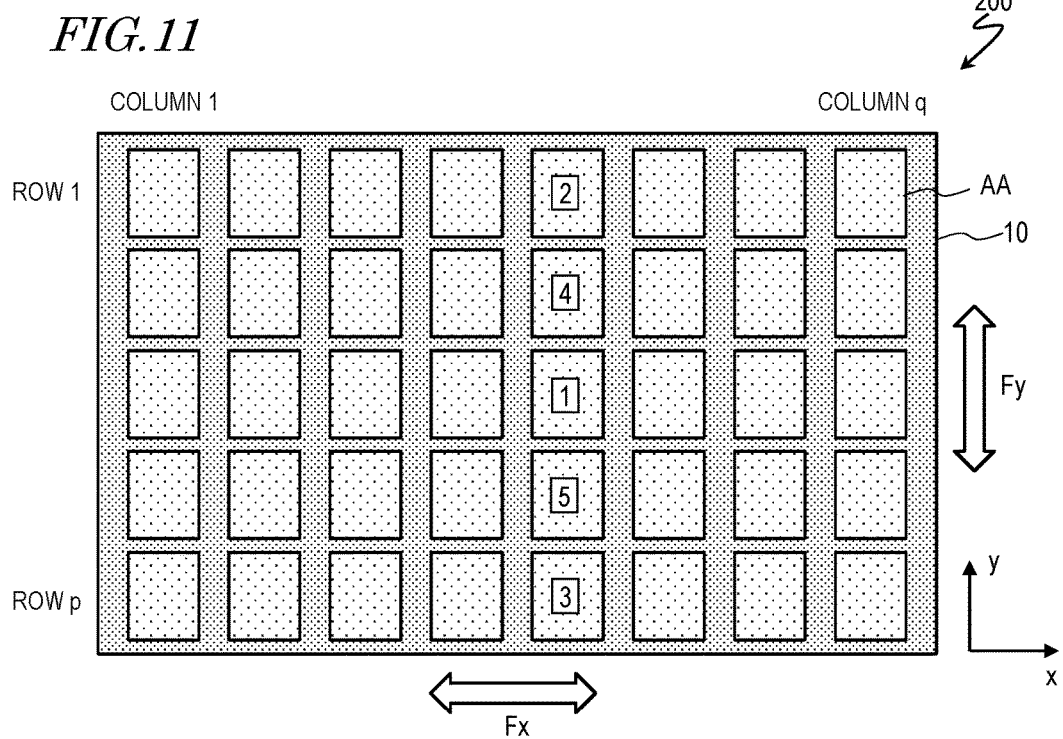
FIG. 11 is a schematic plan view of a mask substrate and is provided to illustrate an order in which openings are formed in a plurality of active region formation portions in a method for producing a deposition mask (stack-type mask) usable to produce a plurality of devices in still another embodiment according to the present invention.

In the case where the opening formation step is performed for the active region formation portions AA one by one, the columns of the active region formation portions AA may be selected in the above-described order, and as shown in FIG. 11, the opening formation step may start with the active region formation portion AA belonging to the (p/2)th row or the {(p+1)/2}th row in each column.

In the above, the order in which the openings are formed is described by way of an example of stack-type mask. An embodiment of the present invention is also applicable to a metal mask.

Figure 12:
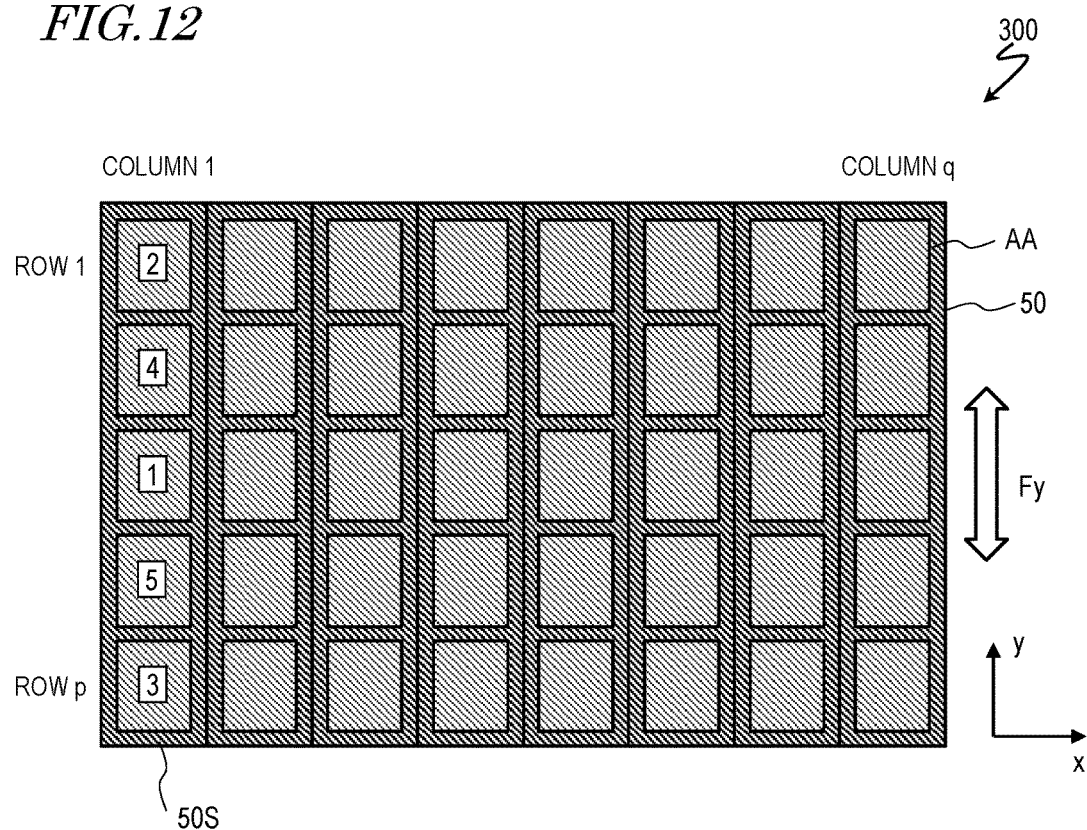
FIG. 12 is a schematic plan view of a mask substrate and is provided to illustrate an order in which openings are formed in a plurality of active region formation portions in a method for producing a deposition mask (metal mask) usable to produce a plurality of devices in still another embodiment according to the present invention.

Referring to FIG. 12, a deposition mask 300 includes a metal layer 50 formed of invar. The metal layer 50 includes an array of a plurality of strip-like metal layers 502, and a perimeter of the metal layer 50 is secured to a frame (not shown) formed of invar. Strip-like pieces of invar are mass-produced, but it is difficult to obtain an invar plate having a size corresponding to the mother substrate. A mask substrate formed of invar is tensioned in a longitudinal direction of the strips-like metal layers (in this example, in the y direction) (not tensioned in the x direction).

In such a case, the eccentricity of the stress distribution in the tensioning direction (y direction) needs to be alleviated. Therefore, it is preferred that as shown in FIG. 12, the formation of the openings starts with the active region formation portions belonging to the (p/2)th row or the {(p+1)/2}th row. The order in each active region formation portion is the same. It is preferred that the formation of the openings starts with the (m/2)th row or the {(m+1)/2}th row, with the row and the column in the above description being replaced with each other.

The active region formation portions AA may be selected in the above-described order, so that the effect of suppressing, to a certain extent, the deformation of the openings caused by the unevenness of the stress distribution is provided regardless of the order in which the openings are formed in each active region formation portion AA.

INDUSTRIAL APPLICABILITY

An embodiment according to the present invention is preferably usable to produce a deposition mask usable for the production of an organic EL device.

REFERENCE SIGNS LIST

10 Resin layer
11 Opening
20 Magnetic metal layer
20a Mask portion
20a1 Solid portion
20a2 Non-solid portion 20b Peripheral portion
21 Through-hole (slit)
100 Deposition mask
AA Active region formation portion
L1, L2 Laser light
R1 First region
R2 Second region
R3 Third region
R4 Fourth region
R5 Fifth region
R6 Sixth region
R7 Seventh region
RS1 First gap region
RS2 Second gap region
RS3 Third gap region
RS4 Fourth gap region

The invention claimed is:

1. A method for producing a deposition mask including a quadrangular mask substrate secured so as to define an xy plane and a plurality of active region formation portions provided on the mask substrate and arrayed in p rows by q columns, the plurality of active region formation portions each including a plurality of openings arrayed in m rows by n columns, the method comprising:
a step of preparing the mask substrate secured so as to define the xy plane; and
an opening formation step of forming the plurality of active region formation portions on the mask substrate;
wherein:
the opening formation step includes:
step A of forming openings of "a" number of continual columns included in a first region including at least the (n/2)th column or the {(n+1)/2}th column;
step B of forming openings of "b" number of continual columns included in a second region adjacent to the first region in a −x direction with a first gap region being sandwiched between the first region and the second region, the first gap region including "sa" number of continual columns; and
step C of forming openings of "c" number of continual columns included in a third region adjacent to the first region in an x direction with a second gap region being sandwiched between the first region and the third region, the second gap region including "sb" number of continual columns; and
the step B and the step C are performed after the step A.

2. The method of claim 1, wherein step D of forming openings in the first gap region, or step E of forming openings in the second gap region, is performed after the step A, the step B and the step C.

3. The method of claim 2, wherein the second region includes the central column in all the regions adjacent to the first region in the −x direction, and the third region includes the central column in all the regions adjacent to the first region in the x direction.

4. The method of claim 3, wherein:
the opening formation step further includes:
step F of forming openings of "d" number of continual columns included in a fourth region adjacent to the second region in the −x direction; and
step G of forming openings of "e" number of continual columns included in a fifth region adjacent to the third region in the x direction; and
the step F or the step G is performed after the step A, the step B and the step C.

5. The method of claim 4, wherein the step F and the step G are performed before the step D and the step E.

6. The method of claim 4, wherein the fourth region is not directly adjacent to the second region, and the fifth region is not directly adjacent to the third region.

7. The method of claim 2, wherein the step D is a step of forming the openings of a number, smaller than "sa", of continual columns that include the central column in all the regions located between the first region and the second region, and the step E is a step of forming the openings of a number, smaller than "sb", of continual columns that include the central column in all the regions located between the first region and the third region.

8. The method of claim 2, wherein:
the fourth region includes the openings of a number, smaller than "d", of continual columns including the central column in all the regions adjacent to the second region in the −x direction; and
the fifth region includes the openings of a number, smaller than "e", of continual columns including the central column in all the regions adjacent to the third region in the x direction.

9. The method of claim 2, wherein:
the opening formation step further includes:
step F of forming openings of "d" number of continual columns included in a fourth region adjacent to the second region in the −x direction with a third gap region being sandwiched between the second region and the fourth region, the third gap region including "sc" number of continual columns; and
step G of forming openings of "e" number of continual columns included in a fifth region adjacent to the third region in the x direction with a fourth gap region being sandwiched between the third region and the fifth region, the fourth gap region including "sd" number of continual columns; and
the step F or the step G is performed after the step A, the step B and the step C.

10. The method of claim 9, wherein the step F and the step G are performed before the step D and the step E.

11. The method of claim 9, wherein the opening formation step further includes:
step H of forming openings of "f" number of continual columns included in a sixth region adjacent to the fourth region in the −x direction; and/or
step I of forming openings of "g" number of continual columns included in a seventh region adjacent to the fifth region in the x direction.

12. The method of claim 1, wherein the "a", "b", "c", "sa" and "sb" are independently 100 or greater and 300 or less.

13. The method of claim 1, wherein the step B and the step C are performed after the step A for all the active region formation portions of an arbitrary column.

14. The method of claim 1, wherein the opening formation step is performed from the active region formation portions belonging to the (q/2)th column or the {(q+1)/2}th column.

15. The method of claim 1, wherein the opening formation step is performed from the active region formation portions belonging to the (p/2)th row or the {(p+1)/2}th row.

16. A method for producing a deposition mask including a quadrangular mask substrate secured so as to define an xy plane and a plurality of active region formation portions provided on the mask substrate and arrayed in p rows by q columns, the plurality of active region formation portions each including a plurality of openings arrayed in m rows by n columns, the method comprising:
a step of preparing the mask substrate secured so as to define the xy plane; and an opening formation step of forming the plurality of active region formation portions on the mask substrate;

wherein the opening formation step is performed from the active region formation portions belonging to the (p/2)th row or the {(p+1)/2}th row.

17. The method of claim 16, wherein the opening formation step is performed from the active region formation portions belonging to the (q/2)th column or the {(q+1)/2}th column.

18. The method of claim 1, wherein the mask substrate includes a resin layer including the plurality of openings and a magnetic metal layer including at least one through-hole exposing the plurality of openings.

19. The method of claim 1, wherein the mask substrate includes a magnetic metal layer including the plurality of openings.

20. The method of claim 16, wherein the mask substrate includes a resin layer including the plurality of openings and a magnetic metal layer including at least one through-hole exposing the plurality of openings.

21. The method of claim 16, wherein the mask substrate includes a magnetic metal layer including the plurality of openings.

* * * * *